US006538753B2

(12) United States Patent
Grodnensky et al.

(10) Patent No.: US 6,538,753 B2
(45) Date of Patent: Mar. 25, 2003

(54) METHOD AND APPARATUS FOR DIMENSION MEASUREMENT OF A PATTERN FORMED BY LITHOGRAPHIC EXPOSURE TOOLS

(75) Inventors: Ilya Grodnensky, Foster City, CA (US); Eric R. Johnson, Los Gatos, CA (US); Steve Slonaker, San Mateo, CA (US)

(73) Assignee: Nikon Precision, Inc., Belmont, CA (US)

( * ) Notice: Subject to any disclaimer, the term of this patent is extended or adjusted under 35 U.S.C. 154(b) by 0 days.

(21) Appl. No.: 09/861,541

(22) Filed: May 22, 2001

(65) Prior Publication Data

US 2002/0180990 A1 Dec. 5, 2002

(51) Int. Cl.⁷ .............................. G01B 11/02
(52) U.S. Cl. ................ 356/625; 356/635; 355/77; 355/53; 430/5
(58) Field of Search ................. 356/625, 628, 356/635, 636, 399–401; 355/53, 55, 57, 77, 67; 430/5, 20, 22, 30, 311; 250/548

(56) References Cited

U.S. PATENT DOCUMENTS

| 4,521,686 A | 6/1985 | Coates et al. |
| 4,908,656 A | 3/1990 | Suwa et al. |
| 5,256,505 A | 10/1993 | Chen et al. |
| 5,508,803 A | 4/1996 | Hibbs et al. |
| 5,629,772 A | 5/1997 | Ausschnitt |
| 5,747,202 A | 5/1998 | Tanaka |
| 5,776,645 A | 7/1998 | Barr et al. |
| 5,933,239 A | 8/1999 | Hoshiyama |
| 5,953,128 A | 9/1999 | Ausschnitt et al. |
| 5,965,309 A | 10/1999 | Ausschnitt et al. |
| 5,976,740 A | 11/1999 | Ausschnitt et al. |
| 6,004,706 A | 12/1999 | Ausschnitt et al. |
| 6,088,113 A | 7/2000 | Kim |
| 6,094,256 A | 7/2000 | Grodnensky et al. |
| 6,128,089 A | 10/2000 | Ausschnitt et al. |
| 6,137,578 A | 10/2000 | Ausschnitt |
| 6,226,074 B1 | 5/2001 | Fujisawa et al. |
| 6,323,945 B1 | 11/2001 | Saito |
| 6,449,031 B1 * | 9/2002 | Grodnensky et al. ......... 355/77 |

FOREIGN PATENT DOCUMENTS

WO        WO 92/11609        7/1992

OTHER PUBLICATIONS

Grodnensky et al.; "Technique for Optical Characterization of Exposure Tool Imaging Performance Down to 100 nm"; J. Vac. Sci. Technol. B 17(6); Nov./Dec. 1999; pp 3285–3290.
A. Starikov; "Exposure Monitor Structure"; SPIE vol. 1261 Integrated Circuit Metrology, Inspection and Process Control IV; 1990; pp 315–324.
C. P. Ausschnitt; "Rapid Optimization of the Lithographic Process Window"; Proc. SPIE vol. 1088; 1989; pp 115–123.
R.A. Ferguson et al.; "Data Analysis Methods for Evaluating Lithographic Performance"; J. Vac. Sci. Technol. B 15(6); Nov./Dec. 1997, pp 2387–2393.
A. K. Wong et al.; "Characterization of Line Width Variation"; Proceedings of SPIE vol. 4000; 2000; pp 184–191.

(List continued on next page.)

Primary Examiner—Hoa Q. Pham
(74) Attorney, Agent, or Firm—Whitham, Curtis & Christofferson, P.C.

(57) ABSTRACT

Increased accuracy of measurement of variation of a critical dimension is achieved through measurement of area of a test mark by detection of intensity of radiation such as broadband light with which at least a portion of a test mark is imaged. The test mark is preferably formed by partial lithographic exposures of overlapping features, preferably lines having a width approximating a critical dimension of interest and at a shallow angle to each other such that the test mark has the shape of a parallelogram or rhombus.

60 Claims, 10 Drawing Sheets

OTHER PUBLICATIONS

C. Schneider et al.; "Automated Photolithography Critical Dimension Controls in a Complex, Mixed Technology, Manufacturing Fab"; 2001 IEEE/SEMI Advanced Semiconductor Manufacturing Conference (IEEE Cat. No. 01CH37160); 2001; pp 33–40.

G. J. Kivenzor; "Self–Sustaining Dose Control System: Ways to Improve the Exposure Process"; Proc. SPEE vol. 4000; 2000; pp 835–842.

C.P. Ausschnitt et al.; "Process Window Metrology"; Proc. SPEE vol. 3998; 2000; pp 158–166.

K. Murray; "Measuring Dimensions Using Murray Daggers"; Semiconductor International; Dec. 1982.

J. P. Kirk; "Astigmatism and Field Curvature from Pin–Bars"; Proc. SPIE vol. 1463; 1991; pp 282–291.

W. H. Arnold et al.; "A Focus Vernier for Optical Lithography"; Proc. SPIE vol. 1926; 1993; pp 380–392.

R. D. Mih et al.; "Using the Focus Monitor Test Mask to Characterize Lithographic Performance"; Proc. SPIE vol. 2440; pp 657–666.

D. Wheeler et al; "Phase Shift Focus Monitor Applications to Lithography Tool Control"; Proc. SPIE vol. 3051; pp 225–233.

T.E. Zavecz et al.; "Critical Dimension Uniformity Prediction and a Method of Discrimination Between Exposure Tool and Process Induced Variation Using Empirical Focal Plane Modeling"; Proceedings of the Microlithography Seminar INTERFACE '97; 1997; pp 155–162.

T. A. Brunner et al.; "Simulations and Experiments with the Phase Shift Focus Monitor"; Proc. SPIE vol. 2726; pp 236–243.

T. A. Brunner et al: "Quantitative Stepper Metrology Using the Focus Test Mask"; Proc. SPIE vol. 2197; 1994; pp541–549.

T. A. Brunner; "New Focus Metrology Technique Using Speical Test Mask"; Microlithography World vol. 3 Winter 1994; pp 5–6, 8, 10, 12–13.

Hua–Yu Liu et al.; "The Application of Alternating Phase–shifting Masks to 140 nm Gate Patterning (II): Mask Design and Manufacturing Tolerances"; Proc. SPIE Vol. 3334; 1998; pp 2–14.

B. Singh et al.; "Linewidth Measurement by Low Voltage SEM"; Proc. SPIE vol. 921; 1988; pp 16–21.

K. Ronse et al.; "CD Control Comparison of Step & Repeat Versus Step & Scan DUV Lithography for Sub–0.25 mu m Gate Printing"; Proc. SPIE vol. 3334; 1993; pp 56–66.

J. Finders et al.; "Optimizing i–Line Lithography for 0.3 mu m Poly–Gate Manufacturing"; Solid State Technology; vol. 40, No. 3; Mar. 1997; pp S5–6, S8, S10, S12, S14.

K. Monahan et al.; "Yield Impact of Cross–Field and Cross–Wafer CD Spatial Uniformity: Collapse of the Deep–UV and 193nm Lithographic Focus Window"; 1999 IEE International Symposium on Semiconductor Manufacturing Conference Proceedings; 1999; pp 114–119.

S. S. H. Naqvi et al.; "Diffractive Techniques for Lithographic Process Monitoring and Control"; J. Vac. Sci. Technol. B 12(6); Nov./Dec. 1994; pp 3600–3606.

L. M. Milner et al.; "Lithography Process Monitor Using Light Diffracted From a Latent Image"; Proc. SPIE vol. 1926; 1993; pp 94–105.

J. P. Kirk; "Review of Photoresist Based Lens Evaluation Methods"; Proc. SPIE vol. 4000; 2000; pp 2–8.

W. H. Arnold; "Thinking Small; Challenges for Metrology at Century's End"; Proc. SPIE vol. 3050; 1997; pp 2–9.

K. Wilder et al.; "Sub–0.35–Micron Critical Dimension Metrology Using Atomic Force Microscopy"; Proc. SPIE vol. 2725; 1996; pp 540–554.

S. J. Rosner et al.; "Fourier Analysis Determination of Best Focus in Sub–Micron Lithography"; Proc. SPIE vol. 2196; 1994; pp 314–320.

R. V. Tan et al.; "Smart Set—An Integrated Approach to Stepper Set–Up and Calibration"; Proc. SPIE vol. 565; 1985; pp 45–54.

J. P. Kirk; "Measurement of Astigmatism in Microlithography Lenses"; Proc. SPIE vol. 3334; 1998; pp 848–854.

T. A. Brunner et al.; "A Stepper Image Monitor for Precise Setup and Characterization"; Proc. SPIE vol. 922; 1988; pp 366–375.

T. A. Brunner et al.; "In Situ Resolution and Overlay Measurement on a Stepper"; Proc. SPIE vol. 535; 1985; pp 6–13.

J. P. Kirk; "Measuring the Aerial Image With an Atomic Force Microscope"; Microlithography World; Winter 1997; pp 4–9.

J. P. Kirk et al.; "Measurement of Microlithography Aerial Image Quality"; Proc. SPIE vol. 2726; pp 410–416.

T.A. Brunner; "Impact of Lens Aberrations on Optical Lithography"; IBM J. Res. Development, vol. 41, No. 1/2; Jan./Mar. 1997.

* cited by examiner

METHOD AND APPARATUS FOR DIMENSION MEASUREMENT OF A PATTERN FORMED BY LITHOGRAPHIC EXPOSURE TOOLS

BACKGROUND OF THE INVENTION

1. Field of the Invention

The present invention generally relates to characterization of lithographic exposures and, more particularly, to measurement of critical dimensions of very small lithographic exposure patterns such as features suitable for formation of semiconductor integrated circuits.

2. Description of the Prior Art

It has been recognized that formation of electrical elements (e.g. transistors, capacitors, interconnects and the like) of integrated circuits at smaller sizes and increased density provides benefits in both performance and functionality. Increased proximity of devices reduces signal propagation time and increases noise immunity while increased numbers of electrical elements on a chip of a given size allow increased circuit complexity and additional signal processing functions to be provided. Improved economy of manufacture also generally results from increased integration density since more electrical elements can be simultaneously formed by a given process.

While semiconductor device designs and the processes for their formation have become highly sophisticated in recent years and many self-aligned processes are known for forming various semiconductor structures at dimensions smaller than lithographic resolution, at least one lithographic process is required for the formation of any active or passive electrical element in order to define its location and its basic dimensions. A lithographic process includes the exposure of a resist with some form of energy (e.g. light, charged particles, x-rays, etc.) to which the resist is sensitive in a pattern which is subsequently developed to remove selected areas of the resist to allow processes to be selectively carried out where resist has been removed. Therefore, the quality of the exposure of the resist is of paramount importance to the formation of integrated circuits in accordance with a given design.

Various techniques are known and have been used to evaluate lithographic exposures and each has become substantially obsolete, in turn, as increased integration density and reduced size of electrical elements has required increased precision of measurement of critical dimensions. Further, increased complexity of integrated circuits and the number of processes required for their formation has required levels of throughput to be maintained or increased to limit manufacturing costs. Therefore there is substantial economic incentive to provide measurement of critical dimensions of lithographic exposure in reduced time.

For example, an exposure of a pattern or feature including a critical dimension of interest can be made with any exposure tool. Generally a test pattern is formed in a reticle and an image thereof projected on a resist-coated target, usually employing the tool to demagnify the image by a factor of four or five. The resist is then developed in the usual manner and the critical dimension measured.

Critical dimensions which are relatively large by current standards could be directly measured by inspection with a scanning electron microscope using the current of backscattered electrons to detect the edges of the feature including the critical dimension of interest. However, this technique requires a period of about ten seconds to measure a single dimension and precision is limited to about five nanometers.

Numerous measurements (e.g. a few dozen to several hundred sites per field over a matrix of several dozen fields on a wafer) are generally made, particularly for calibration of the tool to obtain the best imaging across the entire field as well as during manufacturing to ensure the tool performance remains within tolerances. Such numbers of measurements require substantial time, particularly when about ten seconds are required for each individual measurement with electron microscopy, as alluded to above. Further, scanning electron microscopy requires measurements to be made at high vacuum levels, requiring substantial time to achieve. Such a long measurement time adversely impacts throughput, especially in a manufacturing environment.

Additionally, precision of much less than one nanometer is required for integrated circuit designs at the current state of the art. Increase of electron beam power to reduce measurement time and/or increase precision tends to erode the pattern being measured. Other problems have also been associated with scanning electron microscope measurements. As noted in U.S. Pat. No. 6,094,256, which is fully incorporated by reference, the resolution of even state of the art scanning electron microscopes is only marginally sufficient for present integrated circuit designs and will be insufficient for foreseeable designs.

Further, the nature of electron microscopy requires bombardment of a substrate with particles and the resultant secondary emissions that are captured for imaging can contaminate devices in integrated circuits adjacent the test patterns when applied to manufacturing environments. In such environments, the wafer used for the test exposure is often discarded or the resist removed and the wafer reprocessed without measurements being concurrently made. Moreover, the cost of specialized electron microscope measurements coupled with the low throughput thereof add significantly to the cost of integrated circuit manufacture.

U.S. Pat. No. 6,094,256, however, teaches use of a measurement of a length much larger than the critical dimension in order to provide an indirect measurement of critical dimension width. As disclosed therein, partial exposures of parallel line patterns (where the critical dimension is line width) are made with the patterns displaced through a small angle between partial exposures. This technique results in an array pattern of small parallelograms or rhombus shapes being exposed and developed. The major dimension of the shape between the most widely separated points of the rhombus (hereinafter sometimes referred to as the major, longer or greater diagonal) is related to the critical dimension, CD, by the angle change between the partial exposures in accordance with the equation L CD/sin α. Since sin α is very small at small angles, α, CD is effectively multiplied in the measurement of L. Thus, by choosing a suitably small angle between exposures or an appropriately tapered pattern, a length dimension much larger than the critical width dimension can be measured and a measurement of the critical dimension calculated from that length.

However, even this technique is of marginal sensitivity at very small critical dimensions even though the critical dimension may be greatly multiplied when the angle between partial exposures is small. The width of a scanned laser beam or dimensions of a pixel of a detector such as a charged coupled device (CCD) generally used for detecting the rhombus shaped test marks is necessarily finite and limits resolution of the length measurement that can be made to a similarly finite width of a laser beam in the reflected and diffracted light response peak detected by, for example, a charge coupled device (CCD) array as a laser beam pattern is scanned lengthwise over the marks. The cost of apparatus for producing a sufficiently narrow laser beam to support adequate measurement resolution is also a significant component of the overall cost of integrated circuit manufacture. Further, the information concerning critical dimensions is confined to the tips of the test marks which is a very small portion of the test marks; resulting in inefficiency relative to required chip area of the test marks.

As a practical matter, the amount of multiplication available is limited because the narrow tips of the rhombus shapes become unstable using currently available materials and processes and the measurable length may be uncontrollably foreshortened at very small angles. This effect compromises both the accuracy, precision and repeatability of measurements made. That is, the effects of any such instability is relatively large in comparison with the portion of the test marks which carries information concerning the critical dimension. However, even if this instability could be avoided, the limitation on resolution of length measurements would continue to represent a severe limitation on monitoring variation in CD; effectively preventing such monitoring at dimensions necessary for production of current and foreseeable integrated circuit designs.

SUMMARY OF THE INVENTION

The present invention provides a technique for measurement of critical dimensions of a lithographic exposure which is of increased sensitivity and accuracy without increase of process complexity or economic cost compared to known measurement techniques and characterizes exposure quality in a manner applicable to arbitrarily small critical dimensions. The invention further provides a simple, fast, accurate and repeatable technique for measurement of critical dimensions of a lithographically exposed image such as may be used in semiconductor integrated circuit manufacture and for other purposes.

These and other meritorious effects are achieved by forming a test mark, preferably by making overlapping exposures of features of known dimensions, imaging a portion of the test mark to determine an area of the test mark, and computing a dimension of the test mark from the area signal. Only a single test mark is required for each measurement and the test mark can be of very simple form that can be placed at any location on the wafer and even within an integrated circuit design pattern with little, if any, interference with the desired integrated circuit design. Measurement can be made with broadband light and does not require any special illumination, or scanning or specially adapted optical devices.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
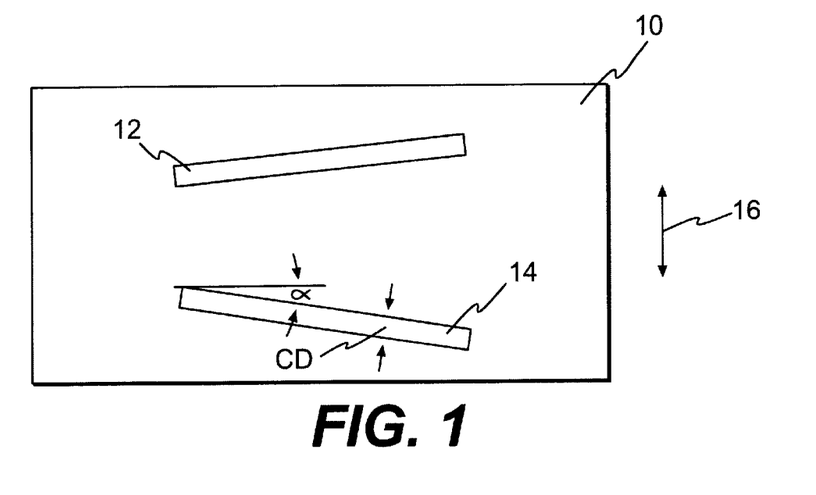
FIG. 1 is a plan view of a reticle useful in the practice of the invention.

Referring now to the drawings, and more particularly to FIG. 1, there is shown, in plan view, an exemplary reticle or portion thereof 10 useful in the practice of the invention. The reticle 10 includes two features 12, 14 in the form of lines having a width preferably equal to the critical dimension CD of interest. These features may be either effectively transparent or opaque (depending on whether a positive or negative imaging response is utilized) and the structure thereof is not critical to the practice of the invention but need only be appropriate to the exposure energy or medium for which the exposure tool is designed. For example, for a charged particle beam tool, the features (or surrounding area) may be apertures through the reticle structure or apertures only in a scattering material such as a high atomic weight metal on a silicon substrate. For short wavelength light exposure tools, the features may include phase shift enhancement features appropriate to the critical dimension to be exposed which are well-understood in the art.

These features are preferably formed to extend at a small angle α to each other which is not critical to the successful practice of the invention. In general, angle α should be chosen to be as small as possible consistent with avoiding a significant degree of instability of the tips of the rhombus shaped mark to be generated therewith. The area=$CD^2$/sin $2\alpha$ and a smaller angle yields a larger area; effectively multiplying CD by a much larger factor than the multiplication of CD in test mark length at similar angles but with much reduced sensitivity to tip shape instability at very small angles, as will be discussed in greater detail below.

Angles as small as 1° have been found to provide reliable and consistent results with current resists. It is to be expected that with resists of reduced thickness, smaller angles (e.g. 0.5°) would be reliable, as well. At such small angles, angle α is preferably provided in the feature placement on the reticle itself to assure simplicity of use by indexing in a single direction, without rotation of the reticle, but may also be provided by rotation of the reticle or other expedients as long as the rotation can be performed consistently.

It should also be noted that, in contrast to the reticle features in the above-incorporated U.S. Pat. No. 6,094,256, the respective features in accordance with the invention need only be a single line since, as will be discussed in greater detail below, enhanced accuracy and resolution is provided by the invention without the need to engender diffraction with an array of test marks or to scan the pattern with a beam of limited width. In fact, broadband and/or non-coherent light can be used for the measurement in accordance with the invention yielding additional economic advantage over the prior technique.

Figure 2:
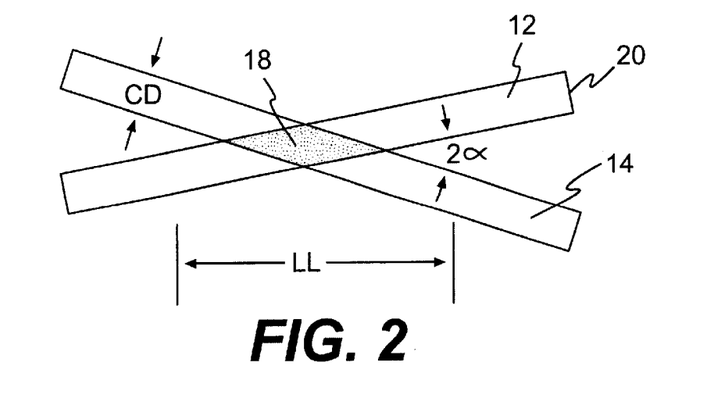
FIG. 2 illustrates formation of a test mark in accordance with the invention using the reticle of FIG. 1.

Further, the length of the features may be substantially limited to a dimension LL just slightly longer than the overlapping region in two partial exposures illustrated in FIG. 2. Therefore, the area required for the test mark (and partial exposures by which it is formed) in accordance with the invention is very much smaller than that used in the above-incorporated U.S. Pat. No. 6,094,256, even at significantly smaller angles, $\alpha$, for increased area and increased multiplication of CD. Therefore, such test marks can be placed unobtrusively on the wafer and even within integrated circuit chip patterns. For example, location of a single test mark between locations of extended, parallel conductors or between arrays of devices separately processed using block-out masking would allow extremely long and large area test marks with very little, if any, impact on the integrated circuit design.

As shown in FIG. 2, the test mark in accordance with the invention is preferably formed by two overlapping partial exposures, possibly in much the same manner as disclosed in the above-incorporated U.S. Pat. No. 6,094,256. That is, an exposure of one of features 12 and 14 is made and the wafer or the reticle or both indexed relative to each other in the direction indicated by double arrow 16 of FIG. 1 and a second partial exposure made such that portions of features 12 and 14 overlap to form a rhombus shaped mark 18.

Figure 3:
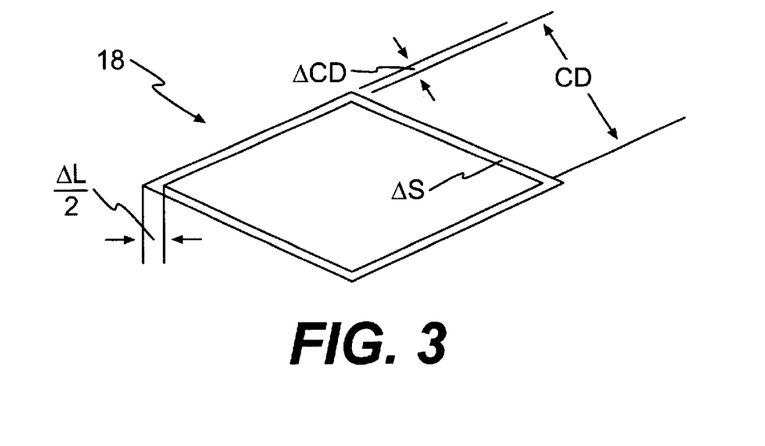
FIG. 3 is a plan view of a test mark in accordance with the invention and illustrating variation thereof.

This rhombus shaped mark 18 is shown in enlarged form in FIG. 3. Variation in the size/critical dimension, $\Delta$CD, of this mark with focus, aberrations and/or exposure dose, development processing, and all other variations in the lithographic process is also shown in FIG. 3. It should be noted that such variation in size cannot result from misregistration of the overlap of features 12 and 14 as long as dimension LL is of adequate length that the end 20 of a feature 12, 14 is not imaged to corrupt the rhombus shape of the mark. Misregistration may slightly alter the location at which the mark is produced but such alteration of location is not important to the successful practice of the invention and the invention is inherently insensitive thereto.

It should be appreciated that the variation in size depicted in FIG. 3 by the change in critical dimension $\Delta$CD results in a magnified difference $\Delta$L ($\Delta$L/2 at each end) in the length of the greater diagonal dimension of the test mark but which remains relatively small due to the angle $\alpha$ chosen and shown in this illustration. However, this dimension would be increasingly subject to error if angle $\alpha$ were to be reduced to provide greater multiplication of $\Delta$CD due to increasing instability of the tips of the mark, as alluded to above and, in any event, is limited in resolution by the finite dimensions of the illumination pattern and/or detector pixel dimensions as discussed above.

In this regard, it is important to an understanding of the principles of the invention that the change in area $\Delta$S due to $\Delta$CD is quite substantial and stable and inherently insensitive to tip shape instability, even at small angles. In fact, since area varies as the square of the critical dimensions, a minimum gain in sensitivity of a factor of two results while the sensitivity is, in fact, further enhanced by several additional factors.

Even more fundamentally, since L=CD/sin $\alpha$ (or, more properly, the length measurement signal is proportional to CD/sin $\alpha$), it follows that $\Delta$L=$\Delta$CD/sin $\alpha$ (or $\Delta$\{length measurement signal\} is proportional to $\Delta$CD/sin $\alpha$) as discussed in the above-incorporated patent. The sensitivity is thus $\Delta$L/L=$\Delta$CD/CD. In accordance with the invention, the area or area signal S=$CD^2$/sin $2\alpha$ and $\Delta$S=2CD$\Delta$CD/sin $2\alpha$ (taking the derivative of the expression for S). Thus the sensitivity of the area measurement in accordance with the invention is $\Delta$S/S=2$\Delta$CD/CD or inherently double the sensitivity of a length measurement however made and regardless of resolution.

Moreover, the signal resulting from change in area, itself, is larger than the signal resulting from change in length for a given change in CD. As before, $\Delta$L=$\Delta$CD/sin $\alpha$. However, the change in the area signal can also be expressed as $\Delta$S=($\Delta$CD/sin $\alpha$)*(CD/cos $\alpha$). Therefore, $\Delta$S=$\Delta$L*(CD/cos $\alpha$). Thus, for a given $\Delta$CD, the change in the area signal is much larger than the change in the length signal by a factor of CD/cos $\alpha$ or CD (since cos $\alpha$ for very small angles approximates 1).

Therefore, measurement of area of the mark provides greatly enhanced sensitivity to variation of critical dimension CD compared to measurement of length even though some magnification of the critical dimension is provided in a length measurement in accordance with the above-incorporated patent while avoiding limitation of resolution by the measurement process and engendering inherent insensitivity to tip shape instability.

By the same token, since the area signal is proportional to the entire area of the mark, the information concerning CD is gathered from an increased portion of the mark, increasing efficiency relative to required chip area and, conversely, the invention is largely insensitive to the quality of imaging of the mark on the sensor at the focal plane of the microscope. Furthermore, there are much more sensitive tools available at lesser cost for measurement of area than for measurement of a length such as a CCD camera, channel electron multipliers, photodiodes and the like but without need for scanning, specialized illumination sources or specialized optical devices.

Figure 4:
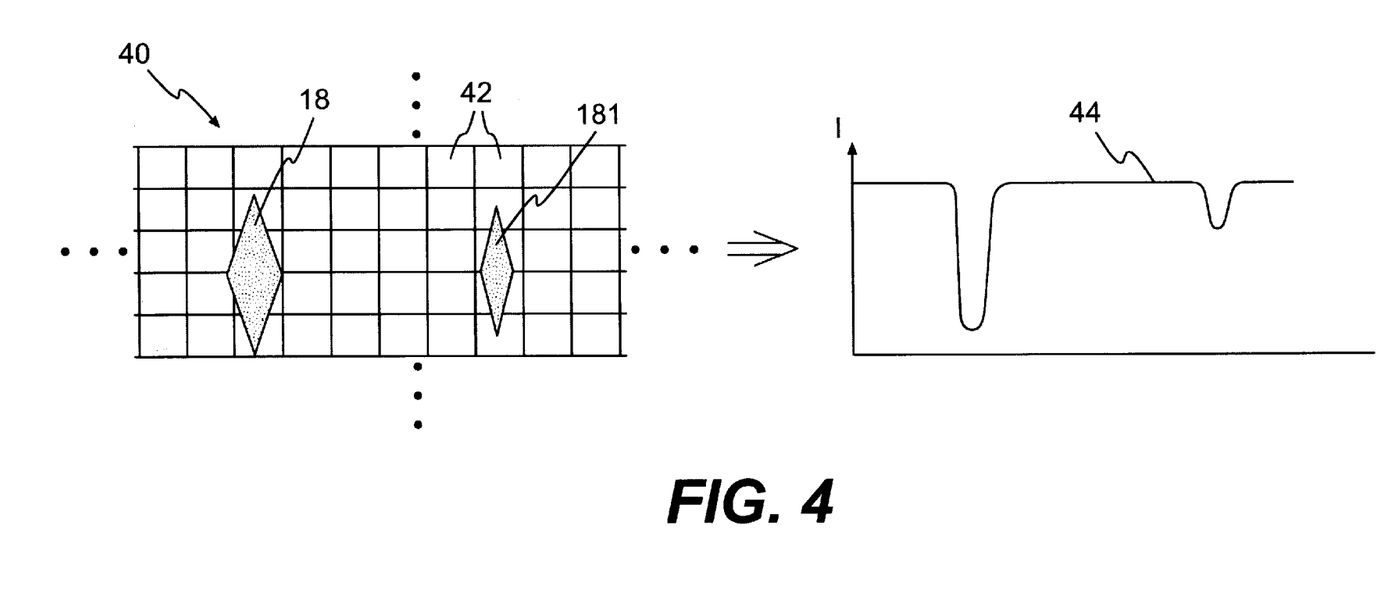
FIG. 4 illustrates measurement of the test mark with an exemplary CCD array.

For example and with reference to FIG. 4, a matrix array 40 of CCD sensor regions 42 is shown with test mark images 18, 18' (or a contour taken at a given intensity level) having different dimensions superimposed thereon. It should be understood that array 40 is representative of a small portion of an exemplary CCD sensor as is generally known in the art. However, the size of CCD sensor regions 42 is somewhat exaggerated in comparison with preferred practice of the invention for purposes of clarity.

A graph showing corresponding signal output from the CCD sensor is also shown. As indicated above, variation in size of the test marks could result from differing focus, aberrations, processing variation and/or exposure at different locations on a resist coated wafer. Since it is preferred that such test marks be created at numerous locations on a wafer, as is facilitated by the simplicity and potentially small or reduced area required for a test mark, the imaging on the CCD sensor portion, as illustrated, is substantially representative of actual practice in utilization of the invention.

As is generally known, a CCD sensor includes numerous individual areas which can detect light. The charge developed at each area is proportional to the amount of light received. The charge, once developed at each sensor area, is shifted out of the CCD sensor along rows or columns to form a serial stream which can then be processed (e.g. integrated over plural rows) as desired to develop a signal 44 corresponding to the image reaching the CCD (or any other type) sensor. Therefore, no scanning of illuminating energy is required other than to accommodate a particular measurement methodology or which is included in a particular sensor technology (e.g. as is inherent in a CCD sensor). The methodology of the present invention, itself, does not require scanning or any particular light source geometry or wavelength as was required by prior measurement methods. In fact, use of relatively even illumination with broadband (e.g. white) light is preferred. Thus, the incorporation of the apparatus of the invention into a lithographic exposure tool is very much simplified while much increased sensitivity is achieved.

Figure 6A:
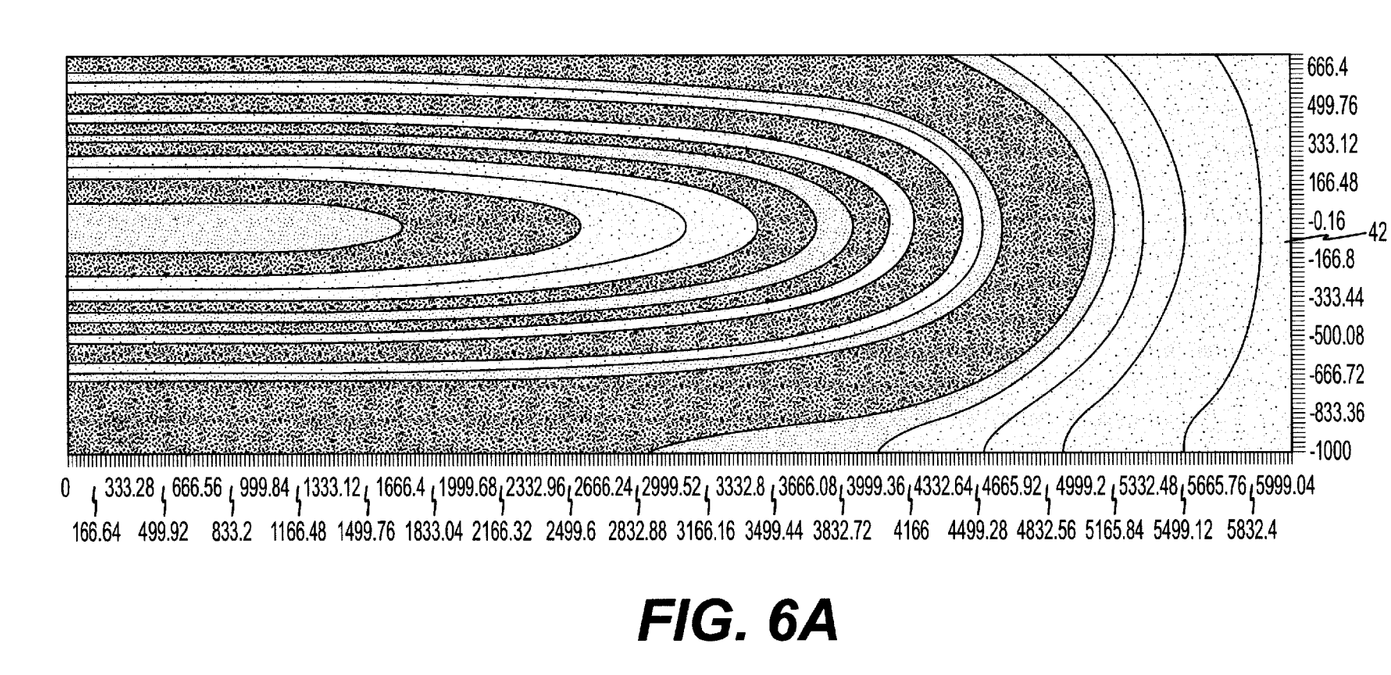
FIGS. 6A and 6B illustrate intensity contours for test mark images of slightly differing size.
Figure 6B:
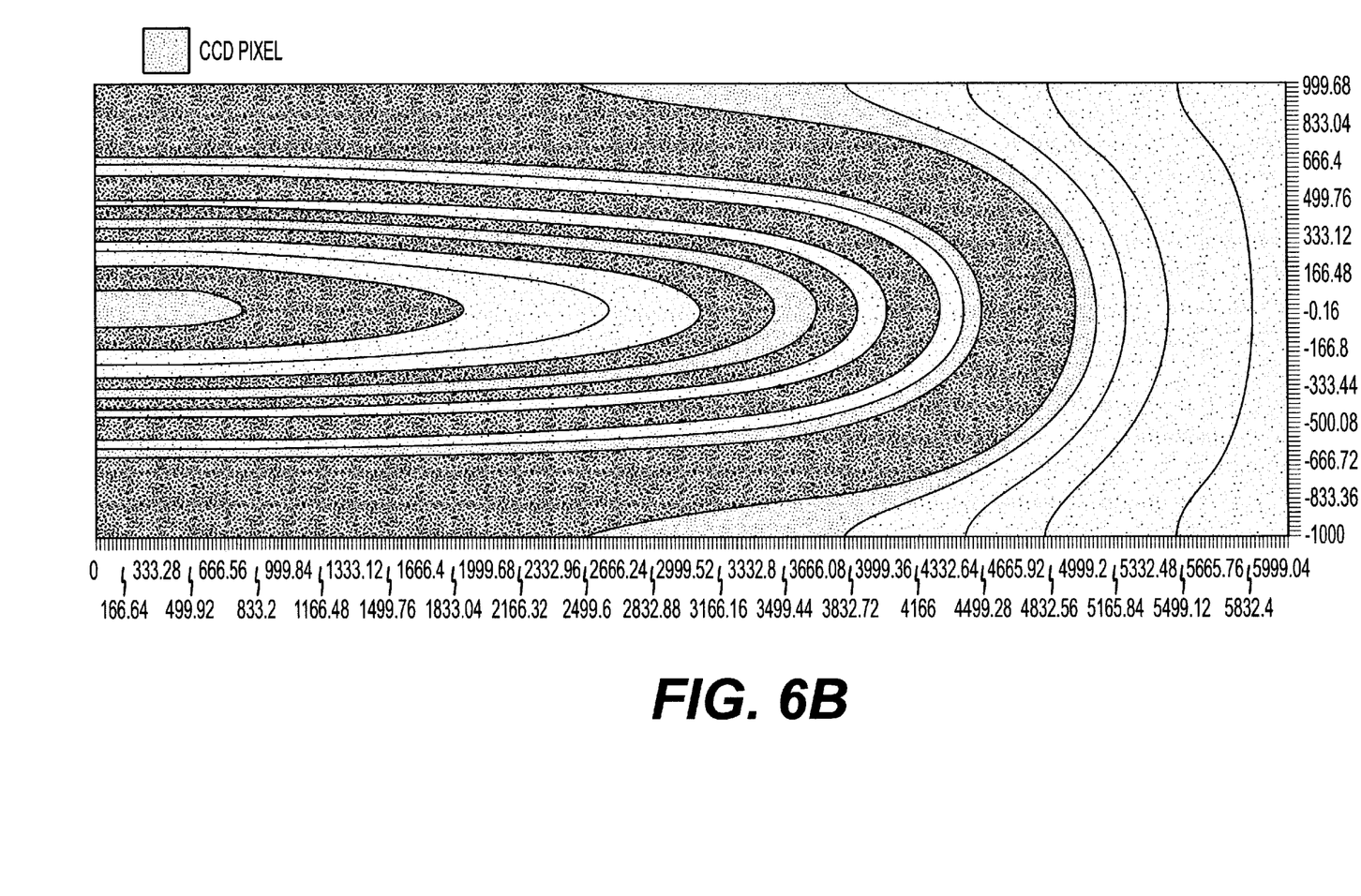

It should also be appreciated that the image of a mark represents an intensity variation over some area and that marks with different CDs will have different intensity variation. This effect is clearly seen in FIGS. 6A and 6B which show image intensity contours for two marks differing in critical dimension of 2.5 nm or about 2%. Accordingly, it is not necessary to integrate the area signal over the entirety of the mark and the invention can be practiced over any sensor area or image area (e.g. corresponding to a plurality of sensor areas) on any portion of any intensity contour of a mark image, even within a mark image since any sensor placed on the focal plane on any imaging arrangement employed will integrate the intensity signal over a given area.

That is, when a mark size changes both the mark contour and the intensity distribution will change accordingly. That is, the rhombus of FIG. 4 more correctly and generally represents a mark contour at a particular intensity level where the contour of a given mark may vary with an intensity threshold at which observation is made. Therefore, the invention may be practiced in regard to any portion of any test mark (as long as corresponding portions of respective test marks are used) and the image intensity detected will accurately correspond to and vary with the critical dimension of the test mark. In this regard, it is considered preferable to utilize signals corresponding to a number of pixels 42 on the major diagonal of the mark which will yield maximum sensitivity to change of reflected or transmitted illumination. Also, the number of pixels on the major diagonal will be greatest in number across any dimension of the test mark and integration of signals therefrom will yield the largest signal-to-noise ratio while limitation of sensing to a single coordinate direction/dimension yields a reduction in image/signal capture time.

Figure 5:
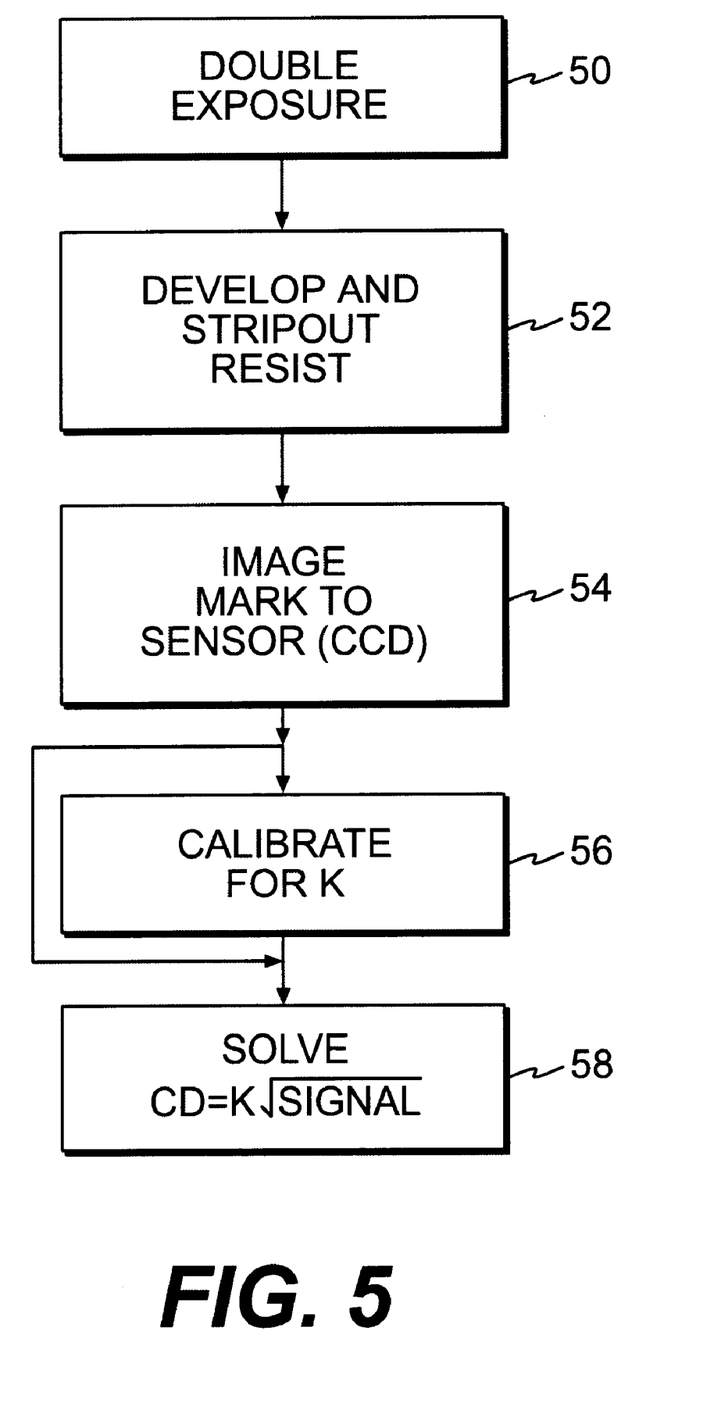
FIG. 5 is a flow chart illustrating the methodology of the invention.

FIG. 5 illustrates the overall methodology of the invention. It is to be understood that this methodology can be carried out during either tool calibration and set up of the lithographic exposure tool or during actual manufacturing of, for example, semiconductor integrated circuits. First, a double exposure is made in the manner disclosed in the above-incorporated U.S. Pat. No. 6,094,256 (except that single line features may be used) as illustrated at 50. Other lithographic exposures may be made simultaneously with or before or after the double exposure. However, separate exposures will generally be made since each exposure of the double exposure is made at a reduced exposure dose which is insufficient to fully expose the resist and form the test mark or any other pattern. Once the test mark exposure is made, the resist may be developed and stripped out of the mark as shown at 52.

When it is desired to make a measurement of CD, the mark is imaged to a sensor (e.g. at the focal plane of an optical microscope) such as a CCD with energy of any desired wavelength(s) as shown at 54. The output signal from a sensor such as a CCD may vary from sensor to sensor (and, to a lesser extent, between areas thereof) and calibration will at least initially be necessary. Calibration may also vary with the angle α at which the overlapping feature exposures are made and calibration should be performed for each reticle used.

However, calibration is relatively simple since sensor output will be proportional to mark area, for a given surface texture, spectral reflectance and the like of the mark and the material of which it is comprised, and calibration can be performed with relatively large marks that can be directly measured to determine the constant of proportionality, K, as shown at 56. (It should be noted that most sensors, including CCD devices, will generally exhibit some degree of non-linearity of output with varying illumination but, as will be evident to those skilled in the art, variations in K can be empirically determined and compensated through appropriate calibration.)

Once K is determined, CD can be simply determined from the sensor signal by computing the square root of the sensor signal and multiplying by the proportionality constant (as calibrated). Since the image of the test mark can be captured rapidly and without scanning of an imaging light source and the computation can be performed rapidly, numerous measurements may be made of marks distributed over a wafer in a very short time; yielding much improved throughput. For example, in accordance with the invention, capture of an image can be accomplished in 0.012 seconds and the image can include multiple test marks which can be distinguished by well-understood feature extraction techniques or similar automated optical inspection processing. This compares very favorably with a 1 second image capture time for scanning of a laser over a mark in a single coordinate direction (two are generally required per mark) or a ten second image capture time using a scanned electron beam (exclusive of time required to establish a sufficient vacuum).

In view of the foregoing, it is seen that the invention provides a technique for measurement of critical dimensions of a lithographic exposure that is of greatly enhanced sensitivity and can be carried out very rapidly with relatively simple and inexpensive apparatus that can be easily and quickly applied to any type of lithographic exposure tool. The measurement can be applied to critical dimensions of much less than one hundred nanometers at a precision of one nanometer or less and provides highly repeatable results for accurate characterization and monitoring of exposure tool performance. This result is particularly apparent from FIGS. 7A–7E which show that measurements of differences in CD using the invention are much more repeatable and of much higher precision and resolution than measurements made using length measurements. In fact, the performance of a length measurement technique cannot be meaningfully depicted graphically at the scales used in these Figures.

Figure 7A:
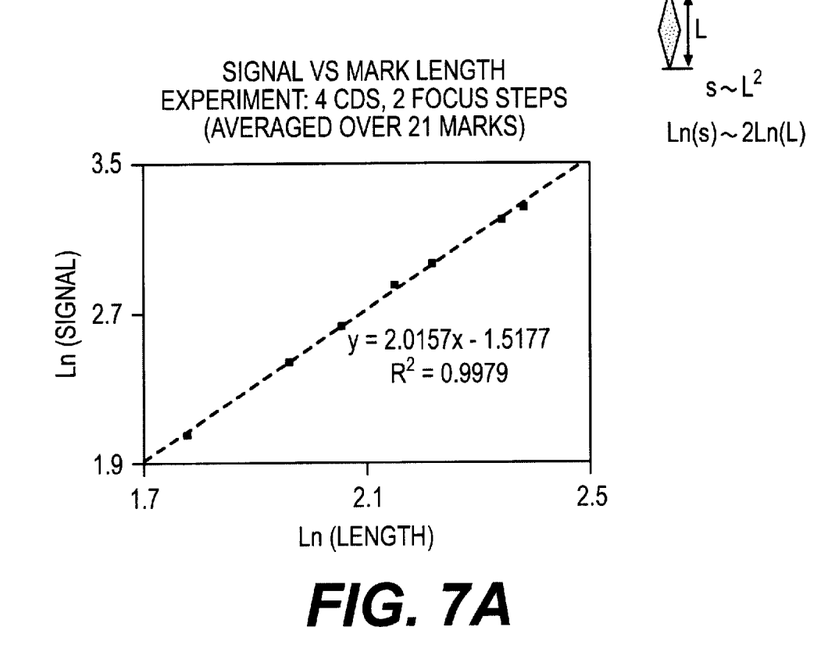
FIGS. 7A, 7B, 7C and 7D show test results indicating a high degree of correlation between measured test mark image area signal and critical dimension.

Specifically, FIG. 7A shows correlation of area signal with length L plotted on a logarithmic scale. The optimum fitting curve, shown with a dashed line, is mathematically expressed as Y=2.015X−1.51 where the slope of 2.015 is the sensitivity of slightly greater than the theoretical minimum improvement over a length measurement system, due to enhancement of sensitivity through other effects as discussed above. The correlation coefficient $R^2$=0.998 or only slightly less than ideal correlation of 1.0.

Figure 7B:
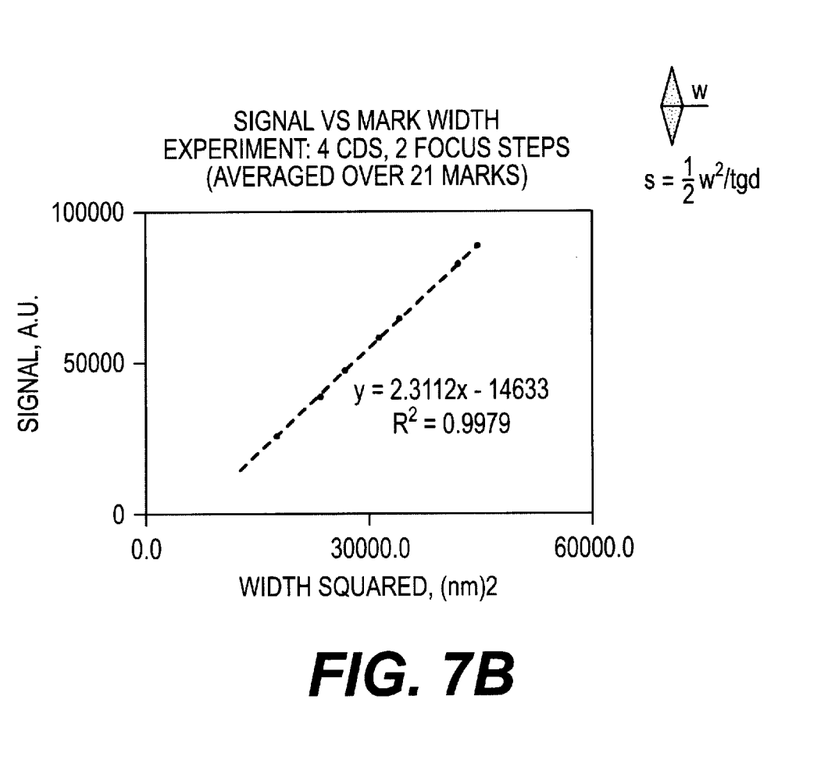
Figure 7C:
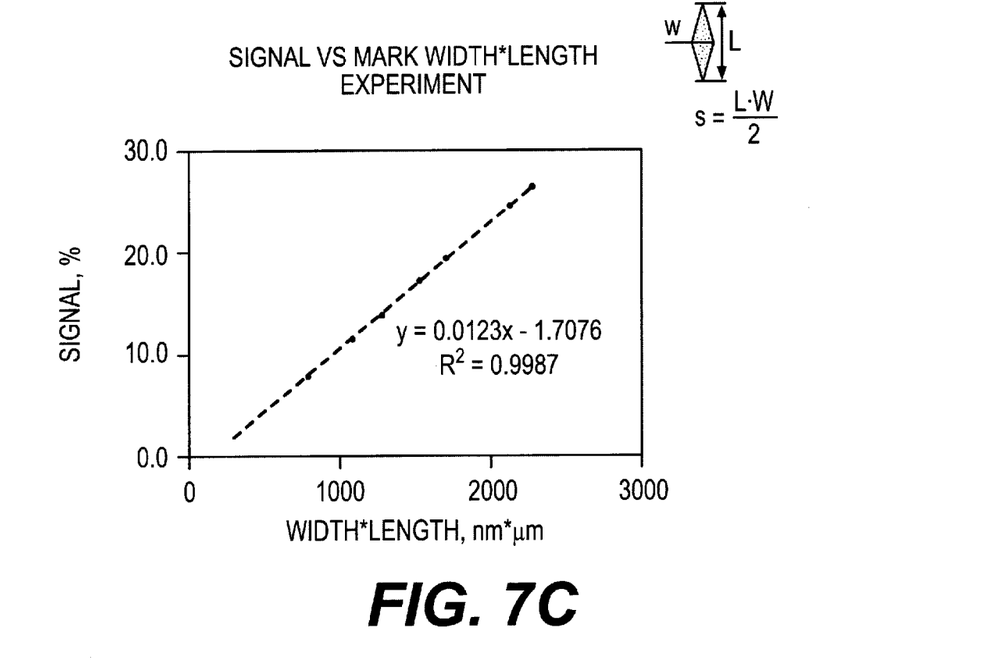
Figure 7D:
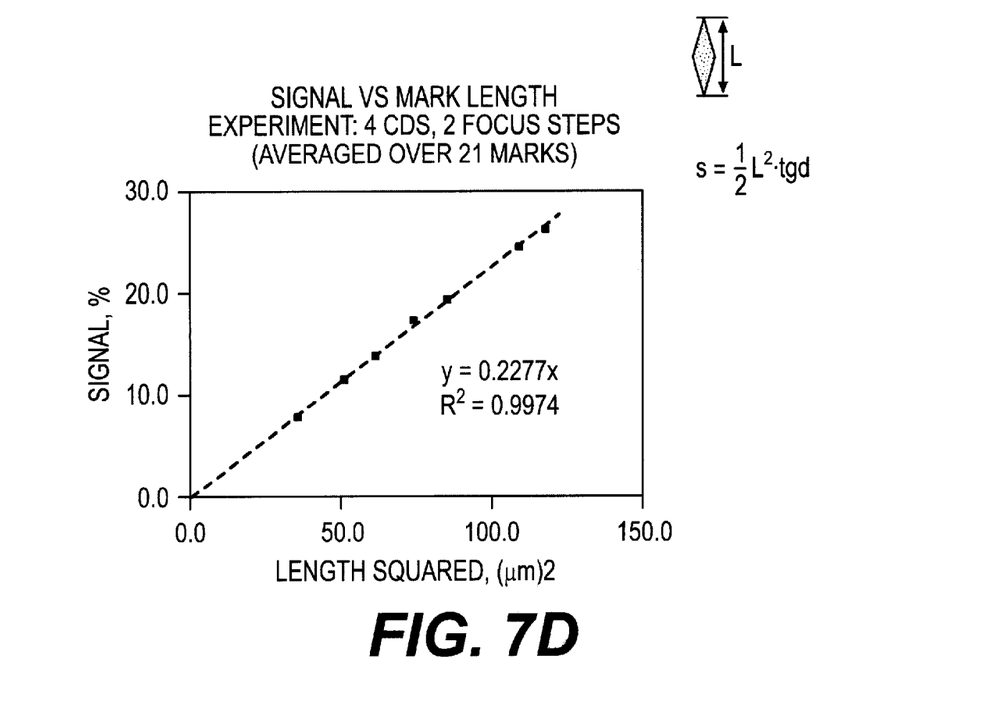

FIG. 7B shows the area signal (in arbitrary, linear units) plotted against the square of mark width W, which approximates the critical dimension CD. FIG. 7C shows the area signal (in arbitrary, linear units) plotted against the product of mark width W and mark length L. FIG. 7D shows the area signal (in arbitrary, linear units) plotted against the square of mark length L. Therefore, it is clear that the area signal is, in practice, accurately proportional to mark area in accordance with the principles of the invention as described above.

Figure 7E:
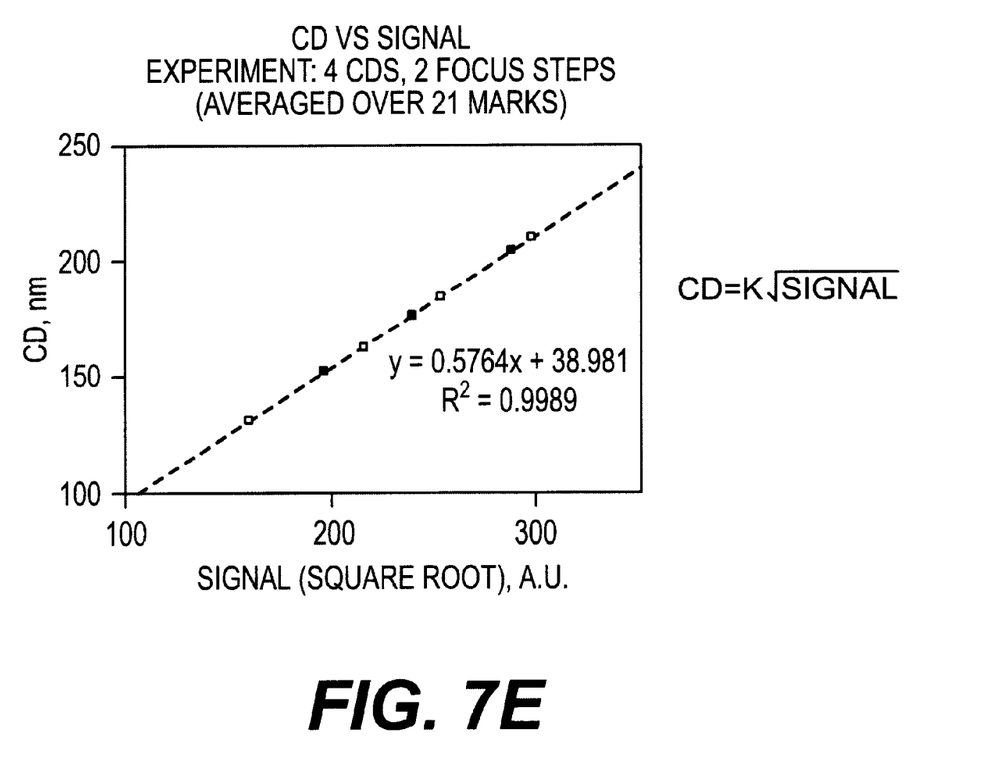
FIG. 7E shows test results relevant to calibration of area signals for measurements of critical dimensions in accordance with the invention.

FIG. 7E shows the critical dimension in nanometers plotted against the square root of of the area signal in arbitrary, linear units. A high degree of linearity of the optimally fitted curve and a high degree of correlation of the area signal with a parameter geometrically related to CD is evident in all of FIGS. 7A–7E.

It should be appreciated that FIG. 7E is a plot of the critical dimension of interest as a function of the square root of the area signal and is mathematically expressed as $Y=0.5764X+38.981$. Therefore, it is seen that, with a very small Y-intercept value (attributable, in this case, to the dark current of the CCD sensor and which is thus readily accounted for during calibration), the parameter of interest is proportional to the square root of the area signal with a very high degree of correlation $R^2=0.9989$. Thus, applied to the critical dimension, CD is clearly proportional to the squarer root of the area signal and determination of the constant of proportionality, K, is easily achieved by fitting a straight line to experimental data. In view of the high correlation of the area signal to the critical dimension, a relatively small amount of experimental data, possibly gathered from relatively large marks which are more easily measured with known techniques will yield relatively high calibration accuracy.

Figure 8:
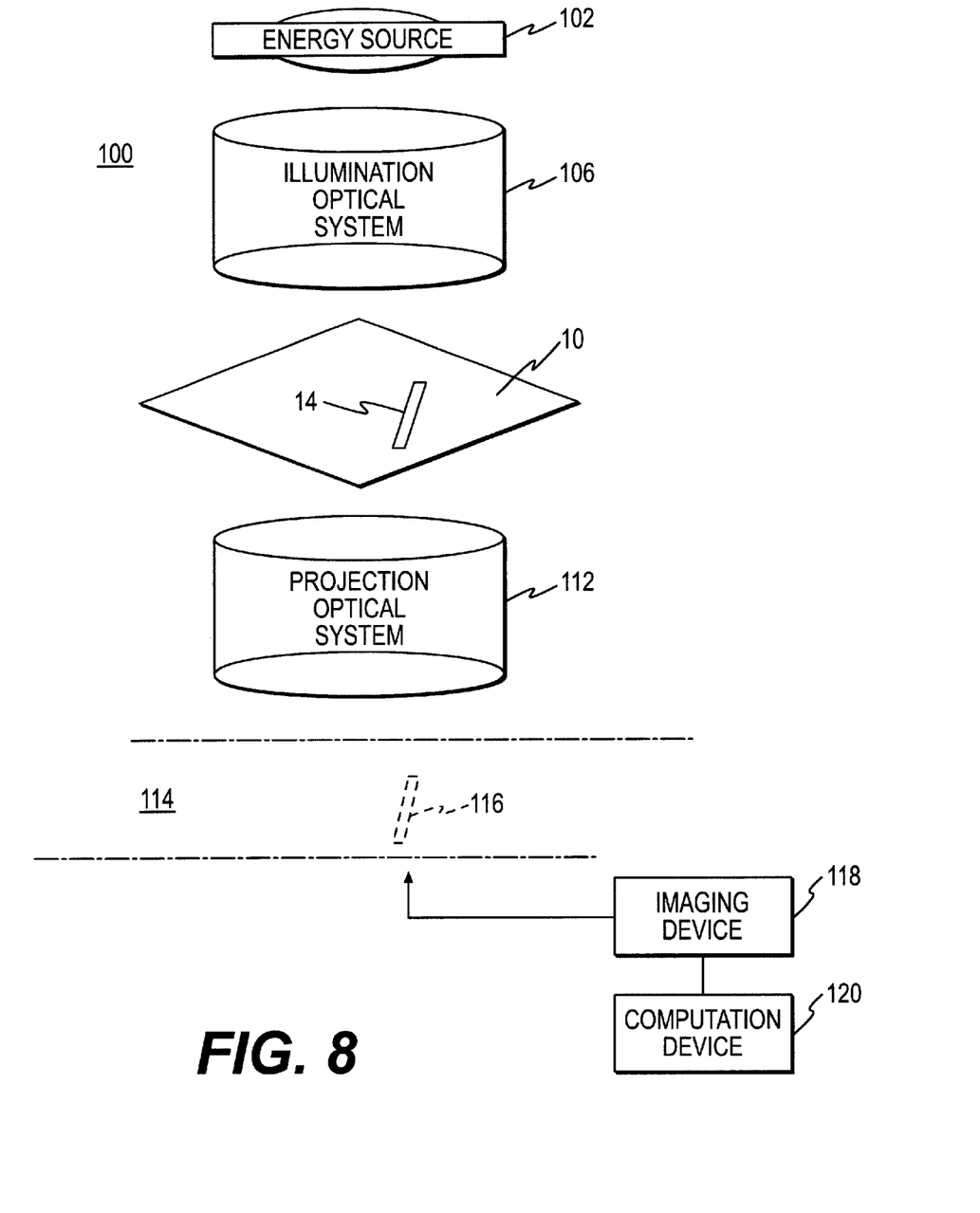
FIG. 8 is a block diagram according to the present invention, showing a projection exposure system including the inventive apparatus.

The present invention may be used in a projection system such as that of FIG. 8, but is not limited to such use.

Referring to FIG. 8, a projection exposure system 100 including an energy source 102 is shown. As those skilled in the art will readily appreciate, energy source 102 can be a high pressure mercury lamp, a krypton fluoride (KrF) laser, an argon fluoride (ArF) laser, an F2 laser, an electron beam radiation source or any other suitable energy emitting device, for example an ion beam source. The energy from energy source 102 passes through illumination optical system 106. Illumination optical system 106 collects the energy from energy source 102 and directs that energy in a regular manner through a reticle 10 (as shown in FIG. 1). While illumination optical system 106 is depicted in FIG. 8 in block form, it will be understood that this is for illustrative reasons only, and that optical system 106 encompasses whatever suitable optical elements are necessary. For example, where energy source 102 is a high pressure mercury lamp, illumination optical system 106 includes a lens structure or mirror optical system. Alternatively, where energy source 102 is an electron beam source, system 106 includes electromagnetic lenses.

Reticle 10 is positioned at the object plane of projection exposure system 100. As known, energy used to define an object is directed through the object (i.e. line 14 as shown in FIGS. 1 and 2) and then projected through projection optical system 112 to form an image 116 at an image plane 114 of exposure system 100 such that image 116 is representative of object 14. Projection optical system 112 encompasses suitable optical elements to project an image of object 108 onto image plane 114. Thus, where energy source 102 is a KrF laser or an ArF laser, projection system 112 includes a multiple element lens. Where energy source 102 is an F2 laser, projection system 112 includes a plurality of refracting optical elements and at least one reflecting optical element. Alternatively, where energy source 102 is an ion beam source, projection system 112 includes a plurality of electromagnetic lenses.

Thus where an image forming device or layer (not shown) is positioned at image plane 114, image 116 is formed thereon. In the block diagram FIG. 8, image 116 is a test mark or a line to be further processed into a test mark. Image plane 114 constitutes a semiconductor device, which may be, for example, a semiconductor die or wafer.

In FIG. 8 according to the invention, it will be appreciated that a portion (not shown) of the test mark 116 (or the test mark produced from a line 116) will have an area indicative of a measurement of a selected critical dimension on the semiconductor device 114.

According to the invention, the projection system shown in FIG. 8 includes an imaging device 118 configured to measure an area of a portion of a test mark formed on a semiconductor device. The imaging device 118 is positioned so as to take such measurements. The imaging device 118 provides the area measurement information to a computation device 120 configured to compute a critical dimension on the semiconductor device from the area measurement.

It will be appreciated that a projection system may contain further components beyond those shown on FIG. 8, and that FIG. 8 is a simplified version of a projection system. For example, the computation device 120 may send computed critical dimension information to a controller (not shown).

Figure 9A:
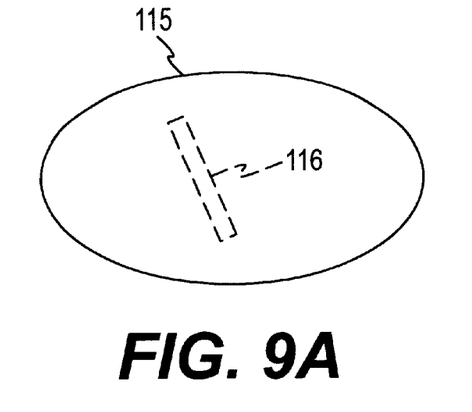
FIG. 9 depicts a series of top views of stages in the production of a semiconductor wafer according to the present invention.
Figure 9B:
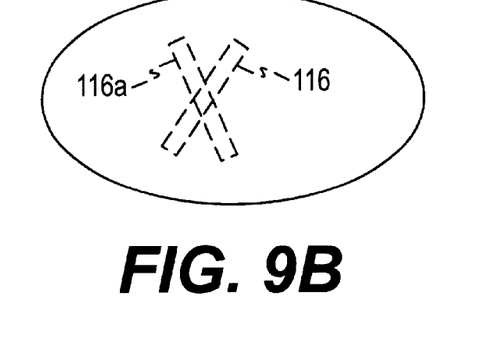
Figure 9C:
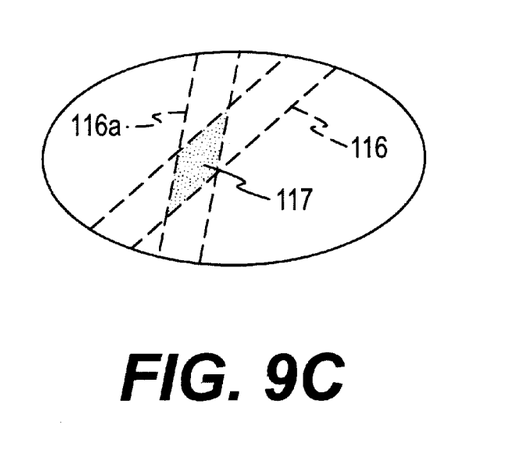

FIG. 8 may be further appreciated with respect to FIGS. 9A, 9B and 9C depicting a semiconductor wafer in three stages of production.

FIG. 9A depicts a wafer 115 with a resist (not shown). A linear test mark 116 has been made. The resist has not yet been developed.

FIG. 9B shows the wafer of FIG. 9A after a second exposure, namely, where test mark forming is by making overlapping exposures of features of known dimensions. Linear test mark 116 remains, and linear test mark 116a additionally has been provided. Where two linear test marks are provided, it is believed that reducing the angle tending the two lines, such as to less than or equal to 1.0° will be preferable, and more preferably, to less than or equal to 0.5°.

FIG. 9C shows the wafer of FIG. 9B after developing and stripping out the resist. Test marks 116 and 116a remain. A portion 117 (shown darkened on FIG. 9C) of the test mark 116 has an area indicative of a measurement of a selected critical dimension on the semiconductor wafer. It should be noted that the critical dimension as measured from the test mark can be used as a parameter to measure the switching characteristics (i.e. operational frequency) of the chips on the wafer and as a parameter to measure the yield on the wafer.

The term "portion" as used herein is not limited by the particular example shown in FIG. 9C, either as to shape nor as to size of the portion 117 with regard to the rest of the test mark, and "portion" should be construed broadly to include a range from the entire area of the test mark as a whole to some small fraction of the test mark such as about one percent (1%) or possibly less.

In a preferred embodiment of the invention, the wafer production shown in FIGS. 9A, 9B and 9C includes a step of characterizing lithographic exposure from the computed dimension of the test mark. The dimension computing of the test mark may be accomplished by calculating critical dimension CD regardless of test mark shape, where $CD=f(signal)^{1/2}$, where:

"f" is a function of one or more variables comprising characteristics of the resist used to form the test mark, instruments used for the area determination and measurement conditions, and "signal" is proportional to the measured test mark area.

Although the embodiment shown in FIG. 9 provides a second exposure, it will be appreciated that in other embodiments of the invention, the test mark forming may be by a single exposure, especially with seemingly ever-improving exposure equipment.

Although the test marks shown in FIG. 9 are relatively linear or rectangular, it will be appreciated that the test marks of the present invention are not restricted in shape, and may be, by way of non-limiting example, round, square, triangular, rectangular, linear or curvilinear.

The methods and apparatuses of the present invention are not limited in their uses, and may be used in (or in combination with) various imaging devices or systems, optical devices, systems used in semiconductor manufacture (e.g., steppers, scanners), microscopes, photo-cameras, of which the preceding are non-limiting examples. The methods and apparatuses of the present invention further may be used in any testing, quality control and evaluation involving printing or imaging very small features, i.e., features close to the optical limit of the imaging system.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of characterizing a lithographic exposure, comprising
   forming a test mark;
   imaging a portion of said test mark to determine an area of said test mark; and
   computing a dimension of the test mark based on the area measurement.
2. A method as recited in claim 1, wherein said imaging step is performed with broadband light.
3. A method as recited in claim 1, wherein said test mark is a single mark formed by overlapping images of lines.
4. A method as recited in claim 3, wherein said lines have a width approximating a critical dimension of interest.
5. A method as recited in claim 4, wherein said lines are displaced at an angle relative to each other.
6. A method as recited in claim 5, wherein said angle is equal to or greater than 1.0°.
7. A method as recited in claim 5, wherein said angle is equal to or greater than 0.5°.
8. A method as recited in claim 3, wherein said lines are displaced at an angle relative to each other.
9. A method as recited in claim 8, wherein said angle is equal to or greater than 1.0°.
10. A method as recited in claim 8, wherein said angle is equal to or greater than 0.5°.
11. A method as recited in claim 8, wherein the angle is less than or equal to 1.0°.
12. A method as recited in claim 8, wherein the angle is less than or equal to 0.5°.
13. A method as recited in claim 1 wherein the test mark forming is by making overlapping exposures of features of known dimensions.
14. A method as recited in claim 1, including characterizing lithographic exposure from the computed dimension of the test mark.
15. A method as recited in claim 1, wherein the test mark forming is by a single exposure.
16. A method as recited in claim 1 in which the dimension computing of the test mark is by calculating critical dimension CD regardless of test mark shape, where $CD = f(\text{signal})^{1/2}$, where
    "f" is a function of one or more of the following variables: characteristics of the resist used to form the test mark, instruments used for the area determination and measurement conditions, and
    "signal" is proportional to the measured test mark area.
17. A method as recited in claim 1 wherein the test mark is one of the following shapes: round, square, triangular, rectangular, linear or curvilinear.
18. A method comprising
    forming a test mark on a semiconductor device;
    measuring an area of a portion of the test mark; and
    computing a critical dimension on the semiconductor device based on the area measurement.
19. A method as recited in claim 18, wherein said measuring step is performed with broadband light.
20. A method as recited in claim 18, wherein said measuring step includes imaging said test mark on a CCD device with an optical microscope.
21. A method as recited in claim 18, wherein said test mark is formed by overlapping images of single lines.
22. A method as recited in claim 21, wherein said lines are displaced at an angle relative to each other.
23. A method as recited in claim 22, wherein the angle is less than or equal to 1.0°.
24. A method as recited in claim 22, wherein the angle is less than or equal to 0.5°.
25. A method as recited in claim 18, wherein said test mark has a width approximating a critical dimension of interest.
26. A method as recited in claim 18 wherein the test mark is formed by making overlapping exposures of features of known dimensions.
27. A method as recited in claim 18, further including characterizing a lithographic exposure from the computed dimension of the test mark.
28. A method as recited in claim 18, wherein the test mark forming is by a single exposure.
29. A method as recited in claim 18 in which the dimension computing of the test mark is by calculating critical dimension CD regardless of test mark shape, where $CD = f(\text{signal})^{1/2}$, where
    "f" is a function of one or more of the following variables: characteristics of the resist used to form the test mark, instruments used for the area determination and measurement conditions, and
    "signal" is proportional to the measured test mark area.
30. A method as recited in claim 18 wherein the test mark is one of the following shapes: round, square, triangular, rectangular, linear or curvilinear.
31. A method as recited in claim 18, wherein said test mark forming is by double exposure.
32. A method as recited in claim 18, comprising developing and stripping out a resist.
33. A method as recited in claim 18, wherein an image mark is sensed by a sensor.
34. A method as recited in claim 33, wherein the sensor is a CCD.
35. A method as recited in claim 18, wherein the computed critical dimension is a parameter indicative of the switching characteristics of the semiconductor device.
36. A method as recited in claim 35, wherein the computed critical dimension is a parameter indicative of the yield of the semiconductor device.
37. An apparatus comprising:
    an imaging device configured to measure an area of a portion of a test mark formed on a semiconductor device; and
    a computation device configured to compute a critical dimension on the semiconductor device from the area measurement.

38. The apparatus of claim 37, wherein the imaging device is integrated into a projection exposure system.

39. The apparatus of claim 37, wherein the computation device is integrated into a projection exposure system.

40. An apparatus comprising:

a semiconductor device;

a test mark formed on the semiconductor device, a portion of the test mark having an area indicative of a measurement of a selected critical dimension on the semiconductor device.

41. The apparatus of claim 40, wherein the semiconductor device is a semiconductor die.

42. The apparatus of claim 40, wherein the semiconductor device is a semiconductor wafer.

43. The apparatus of claim 40, wherein the test mark has been formed by imaging performed with broadband light.

44. The apparatus of claim 40, wherein the test mark is a single mark formed by overlapping images of single lines.

45. The apparatus of claim 44, wherein said lines have a width approximating a critical dimension of interest.

46. The apparatus of claim 45, wherein said lines are displaced at an angle relative to each other.

47. The apparatus of claim 46, wherein said angle is equal to or greater than 1.0°.

48. The apparatus of claim 46, wherein said angle is equal to or greater than 0.5°.

49. The apparatus of claim 44, wherein said lines are displaced at an angle relative to each other.

50. The apparatus of claim 49, wherein said angle is equal to or greater than 1.0°.

51. The apparatus of claim 49, wherein said angle is equal to or greater than 0.5°.

52. The apparatus of claim 44, wherein the angle is less than or equal to 1.0°.

53. The apparatus of claim 44, wherein the angle is less than or equal to 0.5°.

54. The apparatus of claim 40 wherein the test mark is formed by making overlapping exposures of features-of known dimensions.

55. The apparatus of claim 40, wherein the lithographic exposure used to form the test mark can be characterized from the test mark.

56. The apparatus of claim 40, wherein the test mark is formed by a single exposure.

57. The apparatus of claim 40, in which test mark has a calculable critical dimension CD regardless of test mark shape of CD=f (signal)$^{1/2}$, where "f" is a function of one or more of the following variables: characteristics of the resist used to form the test mark, instruments used for the area determination and measurement conditions, and "signal" is proportional to the measured test mark area.

58. The apparatus of claim 40 wherein the test mark is one of the following shapes: round, square, triangular, rectangular, linear or curvilinear.

59. An apparatus as recited in claim 40, wherein the computed critical dimension is a parameter indicative of the switching characteristics of the semiconductor device.

60. An apparatus as recited in claim 40, wherein the computed critical dimension is a parameter indicative of the yield of the semiconductor device.

* * * * *